United States Patent [19]

Noda et al.

[11] Patent Number: 5,801,382
[45] Date of Patent: Sep. 1, 1998

[54] METHOD OF ANALYZING FOREIGN MATERIALS

[75] Inventors: Osamu Noda; Setsuo Norioka, both of Tokyo, Japan

[73] Assignee: Jeol Ltd., Tokyo, Japan

[21] Appl. No.: 889,659

[22] Filed: Jul. 8, 1997

[30] Foreign Application Priority Data

Jul. 9, 1996 [JP] Japan .................... 8-179416

[51] Int. Cl.$^6$ .................................................. H01J 37/00
[52] U.S. Cl. .................................................. 250/310
[58] Field of Search .................... 250/310, 306, 250/307

[56] References Cited

U.S. PATENT DOCUMENTS 5,233,191 8/1993 Noguchi et al. ............ 250/310

OTHER PUBLICATIONS

"EDS Analysis With Wafer Inspection SEM", Katsuhiro Ono et al., *SEMICON Korea 95*, Jan. 20, 1995, KOEX 4th Floor, Seoul, pp. 81–88.

*Primary Examiner*—Kiet T. Nguyen
*Attorney, Agent, or Firm*—Webb Ziesenheim Bruening Logsdon Orkin & Hanson, P.C.

[57] ABSTRACT

A method of quite efficiently analyzing contaminants such as dust on a semiconductor material with a scanning electron microscope. The instrument holds a list of data about contaminants. The operator selects desired items from the list and marks them to register them in a registered contaminant data table. Then, he establishes illumination conditions used for analysis and starts x-ray analysis. A secondary electron image of any contaminant of interest is displayed on a CRT at a magnification corresponding to the dimensions of the contaminant. The dimensions are retrieved from the data table. All addresses of a frame memory are searched. According to the results, the coordinates of the position of the contaminant are measured. The difference between the central position of the viewing screen of the CRT and the coordinate of the contaminant is calculated for each direction. The calculated differences are sent either to a specimen stage-driving mechanism or to an image shift power supply. In this way, the contaminant is automatically centered. The focused electron beam is directed at the center of this contaminant to produce x-rays. If the analysis of this wafer is not yet complete, data about the next contaminant item is retrieved from the registered contaminant data table.

10 Claims, 8 Drawing Sheets

| NO | PX | PY | SX | SY |
|----|----|----|----|----|
| 1 | $PX_1$ | $PY_1$ | $SX_1$ | $SY_1$ |
| 2 | $PX_2$ | $PY_2$ | $SX_2$ | $SY_2$ |
| 3 | $PX_3$ | $PY_3$ | $SX_3$ | $SY_3$ |
| ⋮ | ⋮ | ⋮ | ⋮ | ⋮ |
| 75 | $PX_{75}$ | $PY_{75}$ | $SX_{75}$ | $SY_{75}$ |
| 76 | $PX_{76}$ | $PY_{76}$ | $SX_{76}$ | $SY_{76}$ |
| ⋮ | ⋮ | ⋮ | ⋮ | ⋮ |
FIG. 3
PRIOR ART
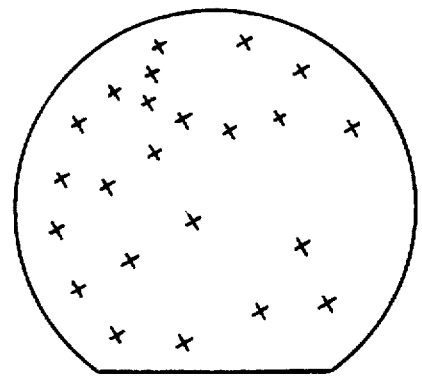
FIG. 4
PRIOR ART
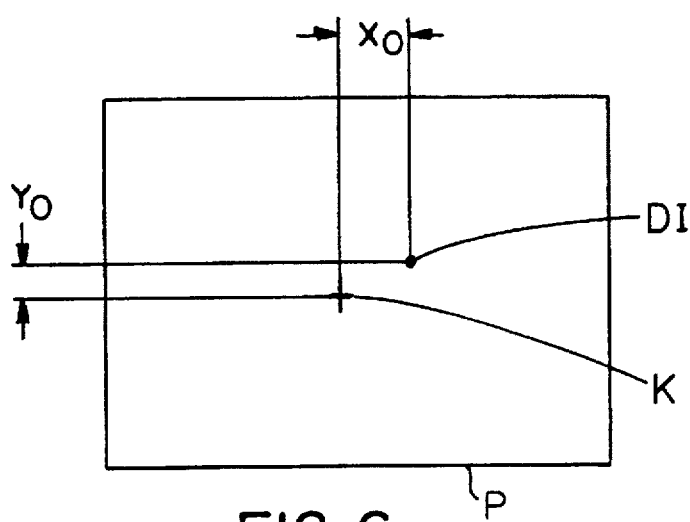
FIG. 6
PRIOR ART

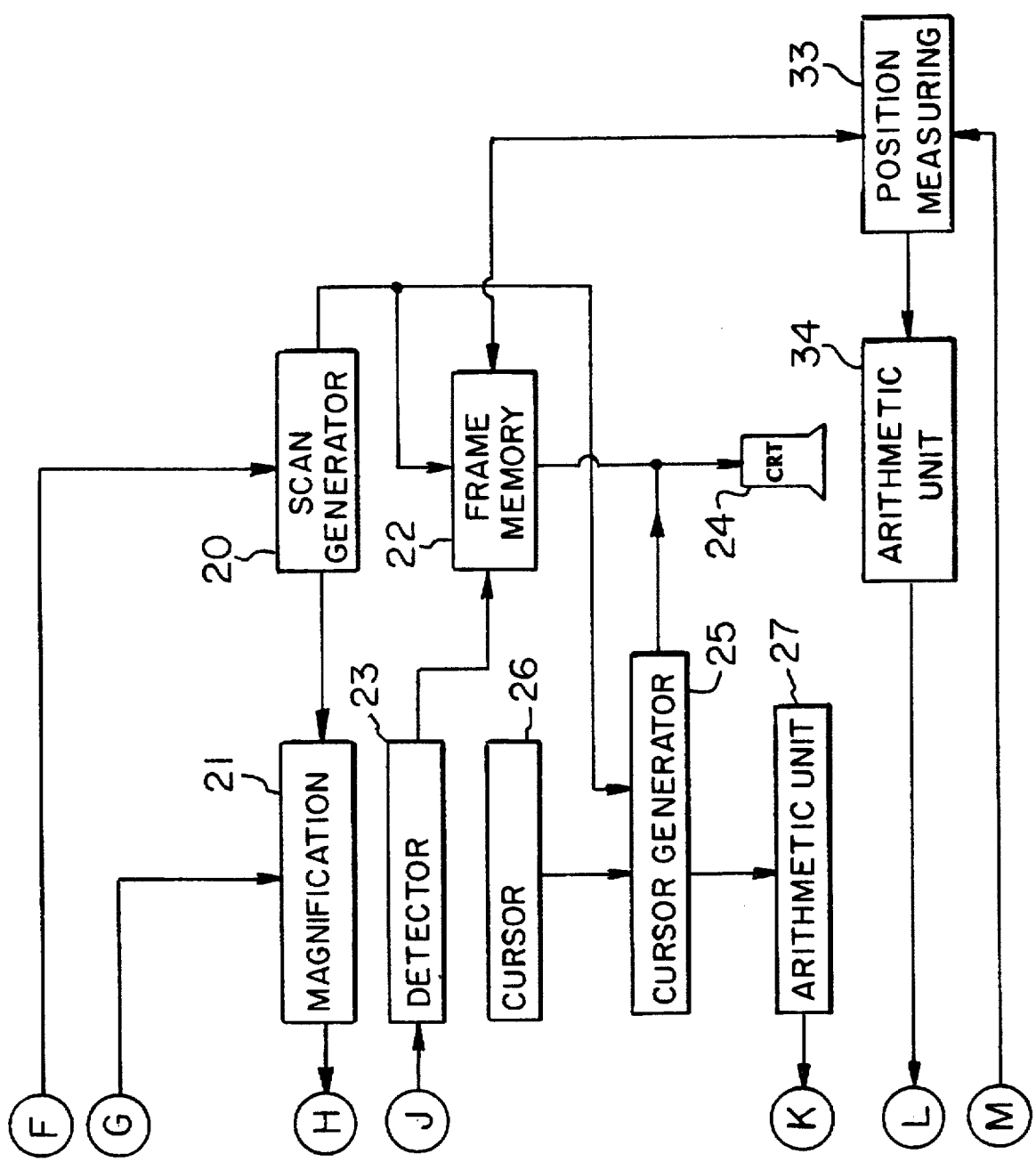

METHOD OF ANALYZING FOREIGN MATERIALS

FIELD OF THE INVENTION

The present invention relates to a method of analyzing foreign materials or contaminants on a material by an x-ray method.

BACKGROUND OF THE INVENTION

In recent years, semiconductor device dimensions have shrunk and packing densities have increased. That is, LSI devices were replaced by VLSI devices. Nowadays, ULSI devices are predominant. Also, there remains a very great demand for semiconductor devices. Under these conditions, improvements in the yield of mass-produced semiconductor devices are of the greatest interest. Therefore, inspection of semiconductor devices during fabrication processes has become very important.

One example of apparatus for inspecting such semiconductor devices is an apparatus for analyzing foreign materials or contaminants. A defect-inspecting apparatus for inspecting foreign materials or contaminants such as dust on a semiconductor material such as a wafer is indicated by numeral 1 in the block diagram of FIG. 1. This defect-inspecting apparatus is commercially available and has a specimen stage on which a wafer to be inspected is placed. Light is directed at the whole surface of this wafer. The reflected light is detected. The apparatus 1 produces information about foreign materials on the water (i.e., the coordinates and the sizes of the foreign materials) according to the reflected light. Referring to FIG. 2, it is assumed that the ends of a foreign material D taken in the X- and Y-directions are located at coordinates $(x_1, x_2)$ and $(y_1, y_2)$, respectively. Suppose that the foreign material D lies at coordinates $(x_1+x_2)/2$, $(y_1+y_2)/2$ midway between those coordinates. It is also assumed that the size of the foreign material has dimensions $X_1$ and $Y_2$ that are between the limits in the X- and Y-directions.

Referring back to FIG. 1, a workstation 2 is a central processing unit used for various operations and control operations. This workstation 2 comprises a coordinate conversion portion 3, a memory 4, a first monitor device 5, a second monitor device 6 for displaying the distribution of foreign materials on the wafer, and a table 7 storing registered illumination conditions (e.g., the accelerating voltage, probe current, magnification) under which x-ray analysis and scanning electron microscopy are performed. The coordinate conversion portion 3 converts the coordinates of each foreign material represented by the output data from the defect-inspecting apparatus 1 and expressed in terms of the coordinate system of the apparatus into coordinates represented in terms of the coordinate system (described later) on the scanning electron microscope. The output data from the conversion portion 3 is stored in the memory 4. The output data about the foreign material from the conversion portion 3 that represent the coordinates of the position and the size of the foreign material are displayed in list form on the first monitor device 5. The workstation 2 has a control panel 8. A mouse 9 is connected with the workstation 2.

A scanning electron microscope column 10 comprises an electron gun 11, a condenser lens system 12, deflecting lenses 13, shift coils SC, a secondary electron detector 14, an x-ray detector 15 (such as an energy-dispersive x-ray detector), and a specimen stage 16. An accelerating voltage source 17 applies an accelerating voltage corresponding to the illumination conditions given by the workstation 2 to the electron gun 11. A lens power supply 18 supplies an exciting coil current corresponding to the illumination conditions to the condenser lens system 12. The shift coils are excited by current supplied from a shift coil power supply SS. A stage-driving mechanism 19 moves the specimen stage in accordance with instructions from the workstation 2.

A scanning signal generator 20 operates according to instructions from the workstation 2, and supplies scanning signals to the deflecting lenses 13 in the microscope column and to a frame memory 22. The output signal from the secondary electron detector 14 is supplied via an amplifier 23 to the frame memory 22, where the signal is stored. This frame memory supplies an image signal according to the output signal from the secondary electron detector to a CRT 24 in accordance with instructions from the workstation 2. As a result, a secondary electron image is displayed on the viewing screen of the CRT. A cursor generator circuit 25 generates a crisscross cursor, for example, on the viewing screen of the CRT 24. A cursor controller 26 permits the operator to move the cursor across the viewing screen. An arithmetic unit 27 calculates the distance between the reference position of the cursor (the center of the viewing screen) and the center of the cursor after it has been moved, and supplies a signal indicating the calculated distance to the stage-driving mechanism 19 or to the shift coil power supply SS. The output signal from the x-ray detector 15 is sent to a well-known x-ray analysis instrument 28, which makes elemental analysis or other analysis according to the input signal. The foreign material-analyzing apparatus constructed in this way operates in the manner described below.

First, a wafer to be inspected is placed on the specimen stage (not shown) of the defect-inspecting apparatus 1 and an inspection is performed to detect foreign materials or contaminants on the wafer. If any foreign material is detected, signals indicating its coordinates and size are produced to the workstation 2. Then, the coordinate conversion portion 3 of this workstation 2 converts the incoming coordinates as described above and stores them in the memory 4. The coordinates and size of the foreign material represented by the output signals from the coordinate conversion portion 3 are displayed in list form on the first monitor device 5. An example of list displayed is shown in FIG. 3, where NO indicates the number given to each foreign material, PX indicates the x-coordinate of the position of the foreign material, PY indicates the y-coordinate of the position of the foreign material, SX indicates the dimension of the foreign material taken in the X-direction, and SY indicates the dimension of the foreign material taken in the Y-direction. Such a list will hereinafter be referred to as a list of data about foreign materials. The distribution of foreign materials on the wafer is presented on the second monitor device 6, as shown in FIG. 4, and indicates that a foreign material is present at each position corresponding to each foreign material position in the aforementioned list of the foreign material data. After the inspection, the wafer is taken out of the defect-inspecting apparatus 1 and placed in position on the specimen stage 16 of the column 10 of the scanning electron microscope. These operations for taking out and placing the wafer may be operated either automatically by a wafer transport mechanism equipped with wafer-handling means and with wafer-alignment means or manually.

Thereafter, foreign materials are analyzed, i.e., elemental analysis (x-ray analysis) is made, as illustrated in the flowchart of FIG. 5. First, a contaminated point to be analyzed is selected from the list of the foreign material data and specified. This is done by moving the cursor across the list displayed on the monitor device 5 by operating the mouse 9 connected with the workstation 2, bringing the cursor to a stop at the location of a desired foreign material number, and clicking. For example, if a foreign material designated as NO. 3 is specified, the workstation 2 sends the coordinates ($PX_3$, $PY_3$) of the position of this foreign material to the stage-driving mechanism 19 or to the shift coil power supply SS. Either the specimen stage 16 or the deflection center of the electron beam is so moved that this foreign material is placed on the optical axis of the electron beam. It is to be noted that movements of the specimen stage are adapted to move the stage over a large distance but the movement accuracy is lower than that of electron beam movements described above. That is, specimen stage movements involve errors. On the other hand, electron beam movements making use of the shift coils SC make it difficult to achieve movement over a large distance but higher movement accuracy is obtained. Accordingly, if the distance between the foreign material corresponding to the above-described foreign material coordinates and the optical axis of the electron beam is more than 20:m, for example, the output signal from the workstation is sent to the stage-driving mechanism 19. If the distance is less than 20:m, the signal is supplied to the shift coil power supply SS. Usually, the distance traveled by the specimen stage is measured with a length-measuring instrument utilizing a laser or the like. The error introduced in the specimen stage is found from the measured distance. Therefore, when the specimen stage is moved, the error is given to the shift coil power supply SS, so that the deflection center of the electron beam moves a distance corresponding to the error.

Then, the operator depresses a selector button (not shown) installed on the workstation 2 to select "analysis mode", thus establishing illumination conditions used for analysis. The illumination conditions have been previously organized as a table. Specifically, on selection of the "analysis mode", signals indicating an accelerating voltage of 12 kV, an exciting probe coil current of 300 pA, and a magnification of 1000×are sent from the illumination condition table 7 in the workstation 2 to the accelerating voltage source 17, the lens power supply 18, and a magnification-setting circuit 21, respectively. At the same time, the workstation 2 sends a SCANNING instruction to the scanning signal generator 20. The electron beam emitted from the electron gun 11 and focused on the wafer is made to scan the wafer in increments according to the set magnification, producing secondary electrons from the wafer. These electrons are detected by the secondary electron detector 14. The output signal from the detector 14 is sent via the amplifier 23 to the frame memory 22, where the signal is stored. The stored signal is retrieved and supplied to the CRT 24 according to instructions from the workstation 2. In consequence, a secondary electron image of the foreign material of the specified NO. 3 is displayed on the viewing screen of the CRT at a desired magnification. Ideally, this secondary electron image is displayed in the center of the viewing screen, which cannot be accomplished because of limited accuracy at which the defect-inspecting apparatus 1 detects foreign materials and because of the difference between the accuracy at which the specimen stage is moved in the defect-inspecting apparatus and the accuracy at which the specimen stage is moved in the scanning electron microscope. Therefore, it is necessary to place the displayed secondary electron image of the foreign material in the center of the viewing screen of the CRT.

Then, a centering operation is performed manually. As mentioned previously, the cursor generator circuit 25 displays a crisscross cursor K on the viewing screen of the CRT 24. At this time, if the cursor generator circuit 25 is operated while the cursor controller 26 is not in operation, the center of the cursor K is placed in the center of the viewing screen P, as shown in FIG. 6. The operator moves the cursor K to the center of the foreign material with the cursor controller 26 while watching the foreign material image DI displayed on the viewing screen. The arithmetic unit 27 calculates the distance ($X_0$, $Y_0$) between the reference position of the cursor (the center of the viewing screen) and the center of the moved cursor, and supplies a signal indicating the calculated distance to the stage-driving mechanism 19 or to the shift coil power supply SS. Either the specimen stage 16 or the electron beam position is moved so that the center of the foreign material image is brought to the center of the viewing screen. Where the specimen stage is shifted, the electron beam is moved after the movement of the stage.

Under this condition, if an x-ray analysis control button (not shown) installed on the workstation 2 is depressed, x-ray analysis, or elemental analysis, of the foreign material is started. X-rays have been already emitted from the wafer including the foreign material and detected by the x-ray detector 15. However, the output signal from the x-ray detector is not supplied to the x-ray analysis instrument 28, for example, unless the x-ray analysis control button (not shown) is depressed.

After the x-ray analysis is initiated in this way, the workstation 2 stops the operation of the scanning signal generator circuit 20. The focused electron beam impinges on only the center of the foreign material, giving rise to x-rays that are detected by the x-ray detector 15. The output signal from the x-ray detector 15 is supplied to the x-ray analysis instrument 28. This instrument 28 identifies the properties and the kind of the foreign material of NO. 3 according to the output signal from the x-ray analysis instrument. The results are stored as a file in the workstation 2. This x-ray analysis instrument 28 performs an automatic qualitative analysis that is adopted by general energy-dispersive analyzers. Since this method of analysis is well known, it is not described in detail herein. To identify the kind of the foreign material, a large number of x-ray spectra are collected and the kind of the foreign material is forecasted. These spectra are collated with the x-ray spectrum obtained at this time. The coincident spectrum is found. Thus, the x-ray analysis at one contaminated point is completed.

If the analysis of this single wafer is not yet complete, the operator selects another contaminated point to be analyzed from the list and specifies the selected point. Operations similar to the foregoing operations are carried out. If this x-ray analysis is the final step for the wafer, this analytical sequence for the wafer ends.

Then, the next wafer is subjected to x-ray analysis or observed with the scanning electron microscope. If the x-ray analysis should be made, it is carried out according to the flowchart illustrated in FIG. 5 provided that the inspection of foreign materials on the water is complete. If the inspection is not yet complete, inspection of foreign materials is started, using the defect-inspecting apparatus 1 described above.

In the prior art method described above, the operator selects a contaminated point of interest from the list of foreign material data and specifies the selected point. It is also possible to specify the desired contaminated point by clicking it on the foreign material distribution diagram (FIG. 4) displayed on the monitor display 6. Also, the illumination conditions used for analysis are established after specifying the desired contaminated point. The illumination conditions may also be established earlier.

5

In the prior art method of analyzing foreign materials, whenever a contaminated point in the list of the foreign material data is specified, x-ray analysis is performed. Therefore, the efficiency is very low. Furthermore, operator's operations are necessary until x-ray analysis of all contaminated points is completed.

SUMMARY OF THE INVENTION

In view of the foregoing, the present invention has been made. It is an object of the present invention to provide a method of quite efficiently analyzing foreign materials or contaminants.

One aspect of the present invention lies in a method of analyzing foreign materials or contaminants by placing a material on a specimen stage of a scanning electron microscope emitting an electron beam and equipped with an x-ray analysis mechanism and by making elemental analysis of any contaminant on the material with the x-ray analysis mechanism. When this elemental analysis is made, a relative movement is produced between the specimen stage and the electron beam according to data about the position of the contaminant. After the movement, the material containing the contaminant is scanned by the electron beam to produce charged particles. The produced charged particles are detected. The distance between the contaminant and the center of the optical axis of the electron beam is found from a signal indicating the detected charged particles. A relative movement is produced between the specimen stage and the electron beam according to the found distance.

Another feature of the invention is that the contaminants to be analyzed as described in the immediately preceding paragraph are plural in number.

A further aspect of the present invention lies in a method of analyzing foreign materials or contaminants by placing a material on a specimen stage of a scanning electron microscope emitting an electron beam and equipped with an x-ray analysis mechanism and by making elemental analysis of any contaminant on the material with the x-ray analysis mechanism. Before plural contaminants to be analyzed is subjected to the elemental analysis, a relative movement is produced between the specimen stage and the electron beam according to data about the positions of the contaminants. After the movement, the material containing the contaminant is scanned by the electron beam to produce charged particles. The produced charged particles are detected. The distance between the contaminant and the center of the optical axis of the electron beam is found from a signal indicating the detected charged particles. This distance is added as a corrective value to data about the contaminants to be subjected to the elemental analysis. When the elemental analysis are made, a relative movement is produced between the specimen stage and the electron beam according to the added corrective value.

A still other aspect of the invention is that the material containing any contaminant is scanned by the electron beam according to a magnification corresponding to the size of the contaminant when it is subjected to elemental analysis.

A yet other aspect of the invention is that only those contaminants which have sizes lying within preset ranges in the X- and Y-directions are selected as contaminants to be analyzed.

An additional aspect of the invention is that only those contaminants which have areas lying within a certain range are selected as contaminants to be analyzed. The area of each contaminant is found from the dimensions taken in the X- and Y-directions, respectively.

6

A still further aspect of the invention is that only those contaminants which have aspect ratios lying within a certain range are selected as contaminants to be analyzed. The aspect ratio of each contaminant is the ratio of the dimension taken in the Y-direction to the dimension taken in the X-direction.

A still additional aspect of the present invention lies in a method of analyzing foreign materials or contaminants on a material by placing the material on a specimen stage of a scanning electron microscope emitting an electron beam and equipped with an x-ray analysis mechanism and by making elemental analysis of base layers located immediately under the contaminants with the x-ray analysis mechanism. Before the contaminants to be analyzed are subjected to elemental analysis, a relative movement is produced between the specimen stage and the electron beam according to data about the positions of the contaminants. After the movement, the material containing the contaminants is scanned by the electron beam to produce charged particles. The produced charged particles are detected. The distance between the contaminant and the center of the optical axis of the electron beam is found from a signal indicating the detected charged particles. This distance is added as a corrective value to data about the contaminants to be subjected to the elemental analysis. When the elemental analysis is made, a relative movement is produced between the specimen stage and the electron beam, depending on the added corrective value and on the size of the contaminant.

A still another feature of the invention is that base layers located immediately under contaminants to be analyzed are separate layers for the plural contaminants.

A yet additional aspect of the present invention lies in a method of analyzing foreign materials or contaminants by placing a material on a specimen stage of a scanning electron microscope emitting an electron beam and equipped with an x-ray analysis mechanism and by making elemental analysis of base layers of the material located immediately under the contaminants with the x-ray analysis mechanism. Before the base layers are subjected to elemental analysis, a relative movement is produced between the specimen stage and the electron beam according to data about the position of each contaminant that is at a distance from the center of the electron beam. After the movement, the material containing the contaminant is scanned by the electron beam to produce charged particles. The produced charged particles are detected. The distance between the contaminant and the center of the optical axis of the electron beam is found from a signal indicating the detected charged particles. The distance is added as a corrective value to the data about the contaminant subjected to elemental analysis. During the elemental analysis, a relative movement is produced between the specimen stage and the electron beam, depending on the added corrective value and on the size of the contaminant.

Other objects and features of the invention will appear in the course of the description thereof, which follows.

BRIEF DESCRIPTION OF THE DRAWINGS

FIG. 3 is a diagram of one example of displayed list of data about foreign materials;

FIG. 4 is a schematic representation of one example of distribution of foreign materials on a wafer;

FIG. 6 is a diagram used to supplement illustration of manual centering;

FIGS. 7(a) and 7(b) are a schematic block diagram of an apparatus for carrying out a method of analyzing foreign materials in accordance with the present invention;

DESCRIPTION OF THE PREFERRED EMBODIMENTS

Figure 1A:
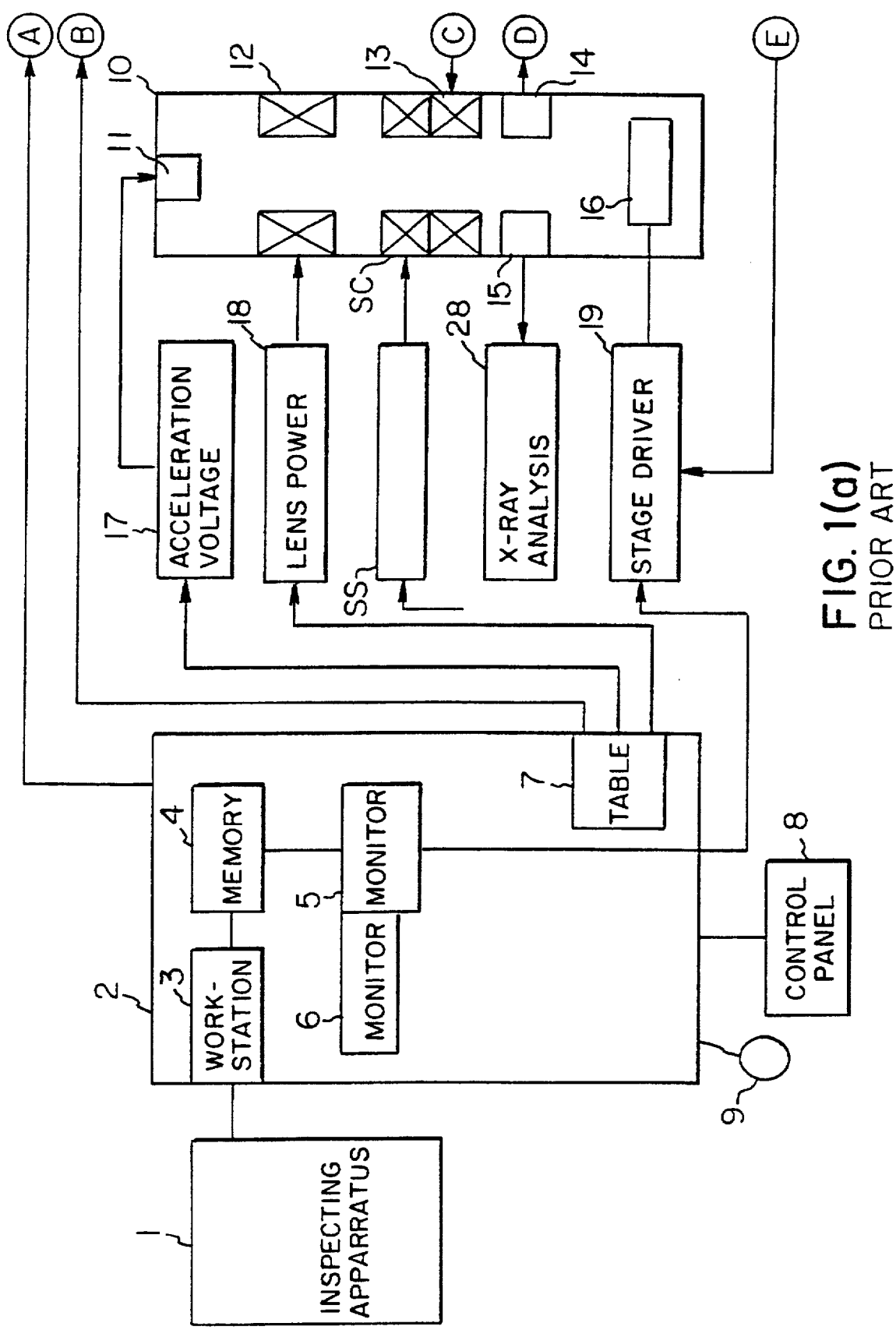
FIGS. 1(a) and 1(b) are a schematic block diagram of an apparatus for carrying out a method of analyzing foreign materials in accordance with a conventional method.

The preferred embodiments of the present invention are hereinafter described in detail by referring to the accompanying drawings. It is to be noted that like components are indicated by like reference numerals in various figures.

Figure 2:
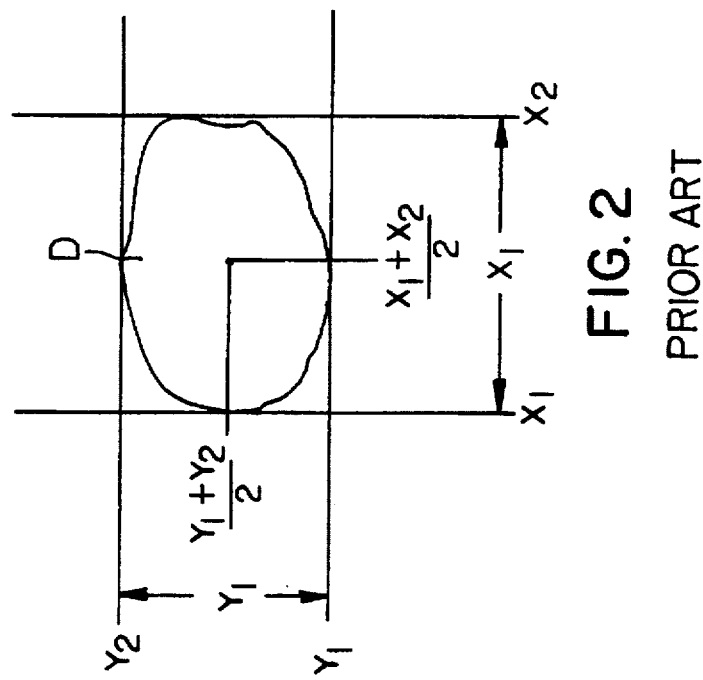
FIG. 2 is a diagram illustrating one example of method of taking coordinates of the position of a foreign material.

Referring to FIG. 7, there is shown a foreign material position-measuring circuit 33 that receives instructions from the workstation 2 and searches all addresses of the frame memory 22 for a foreign material signal, i.e., to find whether a foreign material is present or absent at each address. According to the results of the search, the foreign material position-measuring circuit 33 calculates the midway coordinates $(x_1+x_2)/2$, $(y_1+y_2)/2$ (see FIG. 2) between the coordinates $(x_1, x_2)$ and $(y_1, y_2)$ of the ends of the foreign material taken in the X- and Y-direction. These coordinates are sent as coordinates representing the foreign material to an arithmetic unit 34. This arithmetic unit 34 calculates the difference between the position of the center of the viewing screen of the CRT 24 and the coordinate of the foreign material for each direction. The calculated differences are sent either to the stage-driving mechanism 19 or to the shift coil power supply SS. The dimensions of various foreign materials and the corresponding magnifications at which the magnification-setting circuit 21 should be set are stored in a magnification table 35. Therefore, when data about the dimensions of one foreign material is entered, a signal indicating the corresponding magnification is supplied to the magnification-setting circuit 21. Data about foreign materials to be analyzed are stored in registered foreign material data tables 36 and 37.

Figure 8:
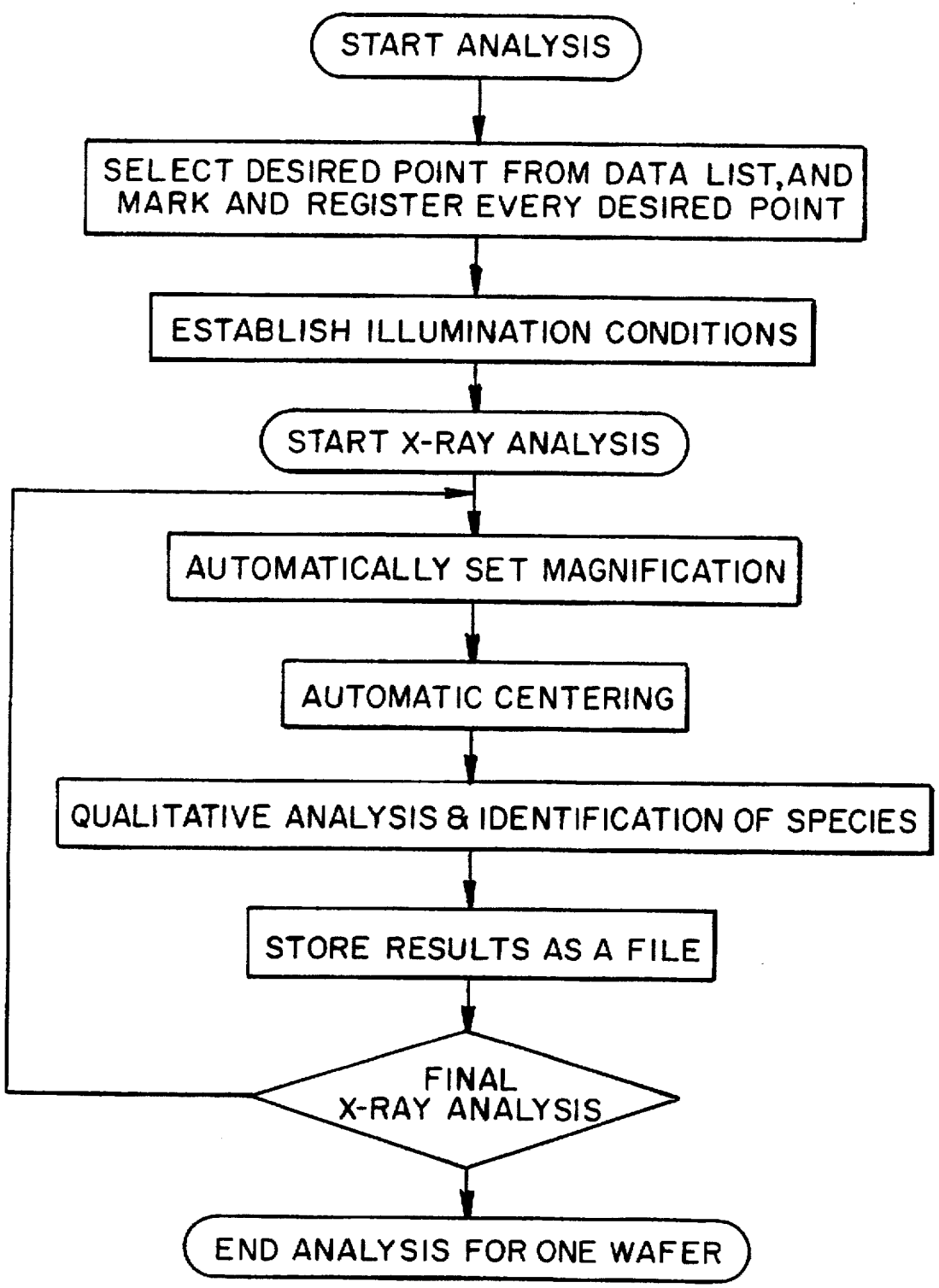
FIG. 8 is a flowchart illustrating an x-ray method of analyzing foreign materials in accordance with the invention.

Each foreign material is subjected to elemental analysis or x-ray analysis by this apparatus in accordance with the flowchart of FIG. 8. A wafer undergone inspection for foreign materials is taken out of the above-described defect-inspecting apparatus 1 and placed in position on the specimen stage 16 in the microscope column 10 of the scanning electron microscope.

First, data about foreign materials are entered into the workstation 2 from the defect-inspecting apparatus 1. The coordinates represented by the data are converted by the coordinate converter portion 3 and stored in the memory 4. A list (see FIG. 3) of the foreign material data is displayed on the monitor display 5 according to the data about the converted coordinates. The operator selects every contaminated point to be analyzed from the list of data and marks or specifies them. Thus, foreign materials to be analyzed are distinguished from those not analyzed. The marked foreign materials are all stored in the registered foreign material data table 36. The marking of one contaminated point is carried out by moving the cursor across the list of the data into the column of the corresponding foreign material number, using the mouse 9, stopping the cursor at this location, and clicking. This marking operation is performed for every foreign material what he wants to analyze. A list of data about only the marked foreign materials is created according to software loaded in the workstation 2. This list is stored in the registered foreign material data table 36.

Then, the selector button (not shown) installed on the workstation 2 is depressed to select the "analysis mode." Thus, the illumination conditions that are used for analysis and have been already organized into a table are established. In response to the selection of the analysis mode, signals indicating an accelerating voltage of 12 kV, an exciting probe current of 300 pA, and a magnification of 1000× are sent from the illumination condition table 7 in the workstation 2 to the accelerating voltage source 17, the lens power supply 18, and the magnification-setting circuit 21, respectively.

Under this condition, if the x-ray analysis control button (not shown) installed on the workstation 2 is depressed, x-ray analysis or elemental analysis of the foreign materials is started. Data about the foreign materials are successively read from the registered foreign material data table 36. Whenever data about one foreign material is read out, x-ray analysis is made in the manner described below.

First, the coordinates of the position of the foreign material are read from the table 36 and sent either to the stage-driving mechanism 19 or to the shift coil power supply SS to produce a relative movement between the specimen stage 16 and the position of the electron beam. As described above, where the specimen stage is moved, the electron beam is subsequently moved. Data about the shorter one of the dimensions of the foreign material taken in the X- and Y-directions is sent to the magnification table 35. A signal indicating the set magnification is sent from the magnification table to the magnification-setting circuit 21. The magnification is changed according to the size of the foreign material for the following reason. If one or both of the above-described dimensions are quite small, and if the foreign material is considerably spaced from the optical axis before the centering operation, a sufficient amount of secondary electrons may not be produced from the foreign material provided that the electron beam is scanned at a fixed magnification common to all foreign materials. Therefore, it is necessary to change the magnification according to the size of the foreign material. At the same time, the workstation 2 sends instructions to the scanning signal generator circuit 20. Consequently, the electron beam emitted from the electron gun 11 and focused on the wafer is scanned across the wafer in increments according to the established magnification, producing secondary electrons. These electrons are detected by the secondary electron detector 14. The output signal from the detector 14 is supplied via the amplifier 23 to the frame memory 22, where the signal is stored. In response to instructions from the workstation 2, the stored signal is read out and supplied to the CRT 24. As a result, a secondary electron image of the foreign material initially registered in response to the marking is displayed on the viewing screen of the CRT at the established magnification.

Then, an automatic centering operation is performed. In response to instructions from the workstation 2, all addresses of the frame memory 22 are searched for a foreign material, i.e., to find whether a foreign material signal is present or absent at each address. According to the results of the search, the foreign material position-measuring circuit 33 measures the coordinates of the position of the foreign material. The measured coordinates are sent to the arithmetic unit 34. This arithmetic unit 34 computes the difference between the position of the center of the viewing screen of the CRT 24 and the coordinate of the foreign material for each direction. The calculated differences are sent either to the stage-driving mechanism 19 or to the shift coil power supply SS, depending on the magnitudes of the differences. As a result, a secondary electron image of the foreign material is displayed around the center of the viewing screen.

Subsequently, the focused electron beam is directed at the center of the foreign material that has been centered as described above. This causes the foreign material to emit x-rays. The emanating x-rays are detected by the x-ray detector 15. The output signal from the detector 15 is sent to the x-ray analysis instrument 28, which automatically qualitatively analyzes the elements of the foreign material and identifies the species of the foreign material. The results are stored in the registered foreign material data table 36. Thus, the x-ray analysis of one contaminated point is completed. If the analysis of this single wafer is not yet complete, data regarding next contaminated point or analysis point is retrieved from the table 36. Operations similar to the foregoing operations are carried out. If this x-ray analysis is the final step for the wafer, this analytical sequence for this wafer ends. In this embodiment, the illumination conditions used for analysis are established after marking the foreign materials of interest. The illumination conditions may also be established earlier.

Figure 9:
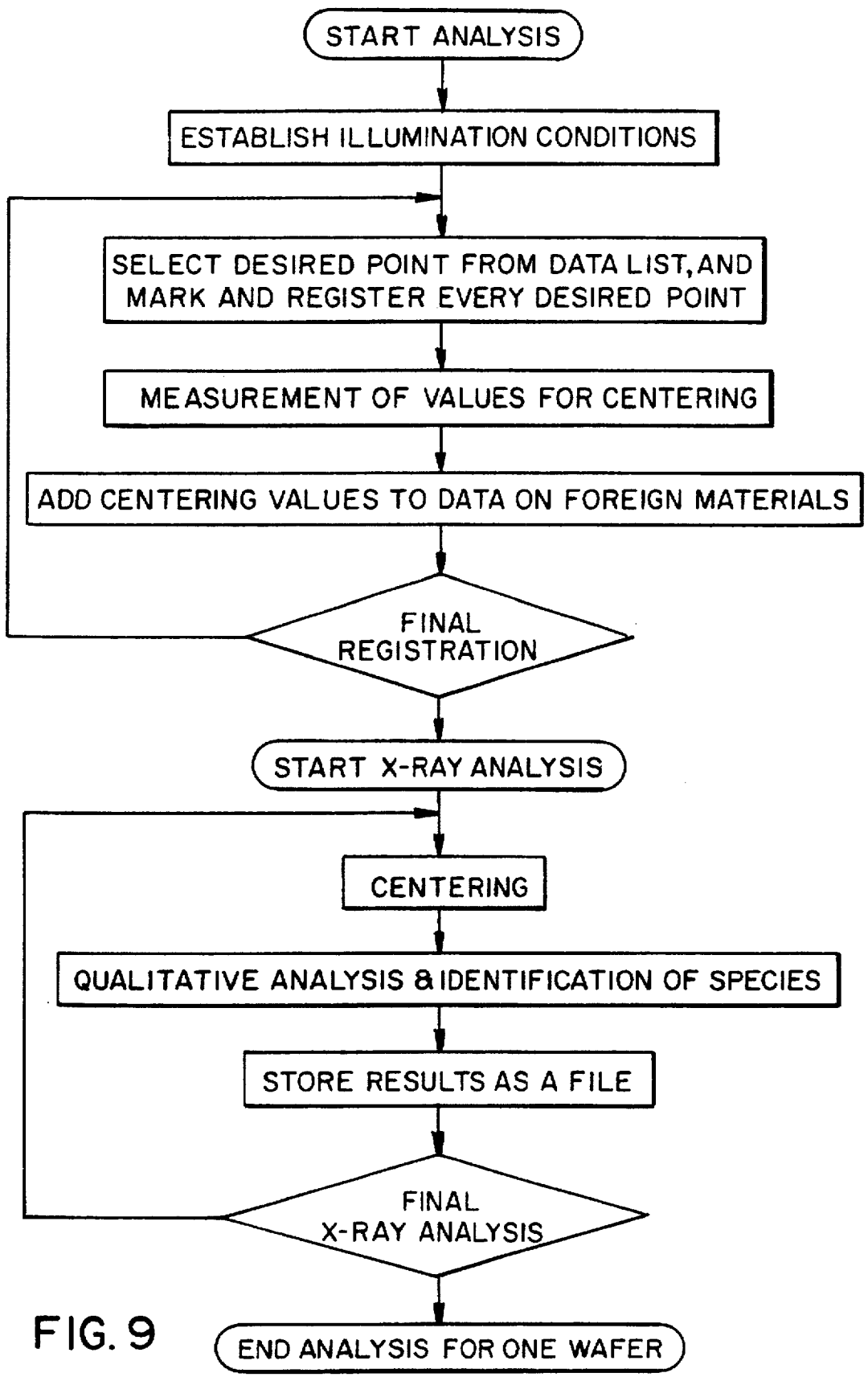
FIG. 9 is a flowchart illustrating another x-ray method of analyzing foreign materials in accordance with the invention.

Another method of analyzing foreign materials by another x-ray method is next described by referring to the flowchart of FIG. 9. This method is similar to the method described above except for the manner in which contaminated points are registered by marking them prior to x-ray analysis. The selector button (not shown) installed on the workstation 2 is depressed to select the "analysis mode." Thus, the illumination conditions that are used for analysis and have been already organized into a table are established. In response to the selection of the analysis mode, signals indicating an accelerating voltage of 12 kV, an exciting probe current of 300 pA, and a magnification of 1000× are sent from the illumination condition table 7 in the workstation 2 to the accelerating voltage source 17, the lens power supply 18, and the magnification-setting circuit 21, respectively.

Then, the operator selects a contaminated point what he wants to analyze from the list of the data about the foreign materials and marks the selected point. The coordinates of the position of this point are sent either to the stage-driving mechanism 19 or to the shift coil power supply SS to produce a relative movement between the specimen stage 16 and the position of the electron beam. As described above, where the specimen stage is moved, the electron beam is subsequently moved. At the same time, the workstation 2 sends instructions to the scanning signal generator circuit 20. Consequently, the electron beam emitted from the electron gun 11 and focused on the wafer is scanned across the wafer in increments according to the established magnification, inducing secondary electrons from the wafer. These electrons are detected by the secondary electron detector 14. The output signal from the detector 14 is supplied via the amplifier 23 to the frame memory 22, where the signal is stored. Then, in response to instructions from the workstation 2, the stored signal is read out and supplied to the CRT 24. As a result, a secondary electron image of the marked foreign material is displayed on the viewing screen of the CRT at the given magnification.

Thereafter, a distance necessary for centering is measured. For instance, the arithmetic unit 34 calculates the difference between the position of the center of the viewing screen and the coordinate of the position of the foreign material for each direction in response to the automatic centering operation described already in connection with FIG. 8. This calculated value is added to the data about the marked foreign material. The resultant data are stored in the registered foreign material data table 37 so as to correspond to the contaminated point.

The operator selects the next contaminated point what he wants to analyze from the list and marks the point. A distance necessary for centering is added to the data about the foreign material in the manner described above. The data about the foreign material is stored in the registered foreign material data table 37 so as to correspond to the contaminated point. In this way, the series of operations is repeated. If the registration made after the marking is complete for this wafer, then the registrations of contaminated points on this single wafer are ended.

Under this condition, if the x-ray analysis control button (not shown) installed on the workstation 2 is depressed, x-ray analysis or elemental analysis of the foreign materials is started. Data about the foreign materials are successively read from the registered foreign material data table 37. Whenever data about one foreign material is read out, x-ray analysis is made in the manner described below.

First, the value necessary for the centering is retrieved from the registered foreign material data table 37 and sent either to the stage-driving mechanism 19 or to the shift coil power supply SS. The foreign material is exactly centered about the optical axis of the scanning electron microscope. The result is that a secondary electron image of the foreign material is displayed on the viewing screen of the CRT 24 at the established magnification.

The focused electron beam hits the center of the centered foreign material, producing x-rays that are detected by the x-ray detector 15. The output signal from the detector is sent to the x-ray analysis instrument 28, which automatically qualitatively analyzes the elements of the foreign material and identifies the species of the foreign material. The results are stored in the registered foreign material data table 37. Thus, the x-ray analysis of one contaminated point is completed. If the analysis of this single wafer is not yet complete, data regarding another contaminated point is retrieved from the table 37. Operations similar to the foregoing operations are carried out. If this x-ray analysis is the final step for the wafer, this analytical sequence for this wafer ends. In this embodiment, the distance necessary for the centering is measured without changing the magnification. The magnification may be varied according to the size of the foreign material and the distance necessary for the centering may be measured, in the same way as in the embodiment described already in conjunction with FIG. 8.

In this embodiment, the value necessary for the centering is measured for every contaminated point what the operator wants to analyze. The measured values are added to the data about the foreign materials. Alternatively, the values necessary for the centering may be measured only for typical contaminated points what he wants to analyze; the values for the other contaminated points to be analyzed may be found from the measured values by an interpolation or extrapolation method. Also in this embodiment, during x-ray analysis, a relative movement is produced between the specimen stage and the position of the electron beam, using only the values necessary for the centering, the values being added to the data concerning the foreign materials. Where the reproducibility of the movement of the specimen stage in the scanning electron microscope is of particular concern, the error introduced in the movement of the specimen stage is measured by a length-measuring instrument utilizing a laser during x-ray analysis, and the error is supplied to the shift coil power supply.

In the embodiments described above, when the electron beam is scanned across the wafer, produced secondary electrons are detected. Other kind of charged particles such as reflected electrons may also be detected. Also in the above embodiments, only the registered foreign materials are subjected to elemental analysis. Base layers immediately under the registered foreign materials may also be subjected to elemental analysis. In this case, the electron beam must be directed at the underlying base layers. Therefore, the relative movement between the specimen stage and the position of the electron beam must be increased by a distance corresponding to the size of the foreign material so that the base layer is brought to the optical axis of the electron beam. Where the extra movement is made in the X-direction, the movement is performed according to the dimension of the foreign material taken in the X-direction. Where the extra movement is made in the Y-direction, the movement is performed according to the dimension of the foreign material taken in the Y-direction.

In the above-described embodiments, contaminated points what the operator wants to analyze are selected from the list of the data about the foreign materials, manually marked, and registered. The instrument may also be programmed so that contaminated points to be analyzed are selected on the basis of dimensions or kind of foreign material. In particular, the coordinates are converted into other coordinates by the coordinate converter portion 3. In this way, data about the foreign materials are stored in the memory 4. For example, the instrument may be so programmed as to automatically select and register only those foreign materials having dimensions, the dimensions being taken in any direction. Also, the instrument may be programmed in such a way as to select only those foreign materials having areas (said areas being found from dimensions taken in X- and Y-direction, respectively) that are more than or less than a given value or lie within a given range. Also, the instrument may be programmed in such a way as to select only those foreign materials having aspect ratios (the ratios of longer dimensions to the shorter dimensions) that are greater than or less than a given value or lie within a given range. In this way, the contaminated points what the operator wants to analyze are automatically registered. This can improve the efficiency of the analysis of foreign materials.

In the present invention, before analysis of chemical elements is performed, foreign materials to be subjected to elemental analysis are prepared. Once the elemental analysis is commenced, foreign materials to be analyzed are automatically centered in succession. Each time a foreign material is centered, the discerned foreign material or the underlying base material or both are automatically analyzed. Therefore, once elemental analysis is started, all foreign materials to be analyzed are automatically analyzed. This greatly improves the efficiency. After the start of the analysis, no operator's operations are necessary.

The instrument is so programmed that contaminated points are automatically registered as described above. Also, the instrument may be programmed such that selection of the analysis mode and initiation of x-ray analysis are automatically done. In this case, once the wafer is placed on the specimen stage of the scanning electron microscope, the wafer is fully automatically analyzed. This further enhances the efficiency. Hence, the instrument is quite easy to handle.

Where wafers undergone inspection for foreign materials are successively automatically placed on the specimen stage of the scanning electron microscope, analysis of the numerous wafers is fully automated. This immensely improves the throughput.

What is claimed is:

1. A method of analyzing foreign materials or contaminants by placing a material on a specimen stage of a scanning electron microscope emitting an electron beam and equipped with an x-ray analysis mechanism and by making elemental analysis of any contaminant on the material with the x-ray analysis mechanism, said method comprising the steps of:

producing a relative movement between said specimen stage and said electron beam according to data about the position of the contaminant that is at a distance from the center of the electron beam;

then scanning said material containing the contaminant by the electron beam to produce charged particles;

detecting a signal representing said produced charged particles;

finding from said signal the distance between said contaminant and the center of an optical axis of said electron beam; and producing a relative movement between said specimen stage and said electron beam according to said found distance.

2. The method of claim 1, wherein plural contaminants are analyzed.

3. The method of any one of claims 1 and 2, wherein, when the contaminant is subjected to elemental analysis, the material containing said contaminant is scanned by the electron beam according to a magnification corresponding to size of said contaminant.

4. The method of any one of claims 1 and 2, wherein only contaminants having dimensions lying within a preset given range are selected as contaminants to be analyzed, said dimensions being taken in any one of X- and Y-directions.

5. The method of any one of claims 1 and 2, wherein only contaminants having areas lying within a given range are selected as contaminants to be analyzed, said areas being found from dimensions taken in X- and Y-directions, respectively.

6. The method of any one of claims 1 and 2, wherein only those contaminants which have aspect ratios of longer dimensions to shorter dimensions lying within a certain range are selected as contaminants to be analyzed.

7. A method of analyzing foreign materials or contaminants by placing a material on a specimen stage of a scanning electron microscope emitting an electron beam and equipped with an x-ray analysis mechanism and by making elemental analysis of any contaminant on the material with the x-ray analysis mechanism, said method comprising the steps of:

producing a relative movement between said specimen stage and said electron beam according to data about the position of any contaminant that is at a distance from the center of the electron beam prior to the elemental analysis of the plural contaminants to be analyzed;

then scanning said material containing the contaminant by the electron beam to produce charged particles;

detecting a signal representing said produced charged particles;

finding from said signal the distance between said contaminant and the center of an optical axis of said electron beam;

adding said found distance as a corrective value to the data about the foreign material subjected to elemental analysis; and producing a relative movement between said specimen stage and said electron beam according to said added corrective value during the elemental analysis of the contaminant.

8. A method of analyzing foreign materials or contaminants by placing a material on a specimen stage of a scanning electron microscope emitting an electron beam and equipped with an x-ray analysis mechanism and by making elemental analysis of a base layer located immediately under said contaminant with said x-ray analysis mechanism, said method comprising the steps of:

producing a relative movement between said specimen stage and said electron beam according to data about the position of the contaminant that is at a distance from the center of the electron beam;

then scanning said material containing the contaminant by the electron beam to produce charged particles;

detecting a signal representing said produced charged particles;

finding from said signal the distance between said contaminant and the center of an optical axis of said electron beam; and producing a relative movement between said specimen stage and said electron beam, depending on said found distance and on size of said contaminant.

9. The method of claim 8, wherein base layers located immediately under contaminants to be analyzed are separate layers for the plural contaminants.

10. A method of analyzing foreign materials or contaminants by placing a material on a specimen stage of a scanning electron microscope emitting an electron beam and equipped with an x-ray analysis mechanism and by making elemental analysis of base layers located immediately under said contaminants with said x-ray analysis mechanism, said method comprising the steps of:

producing a relative movement between said specimen stage and said electron beam according to data about the position of each contaminant that is at a distance from the center of the electron beam prior to the elemental analysis of base layers located immediately under plural contaminants to be analyzed;

then scanning said material containing the contaminant by the electron beam to produce charged particles;

detecting a signal representing said produced charged particles;

finding from said signal the distance between said contaminant and the center of an optical axis of said electron beam;

adding said found distance as a corrective value to the data about the contaminants to be analyzed; and producing a relative movement between said specimen stage and said electron beam, depending on said found distance and on size of said contaminant, during the elemental analysis.

* * * * *

UNITED STATES PATENT AND TRADEMARK OFFICE
CERTIFICATE OF CORRECTION

Figure 1B:
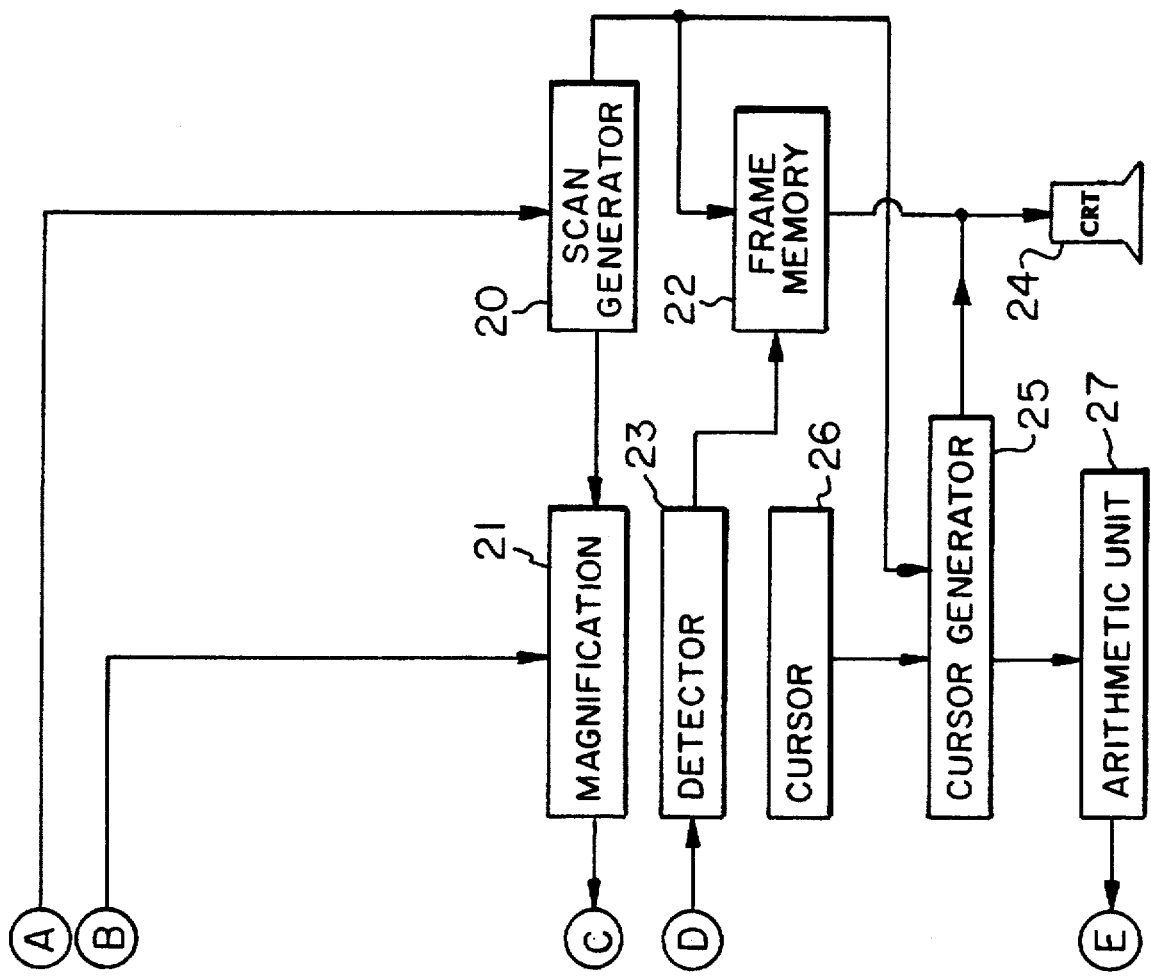
Figure 5:
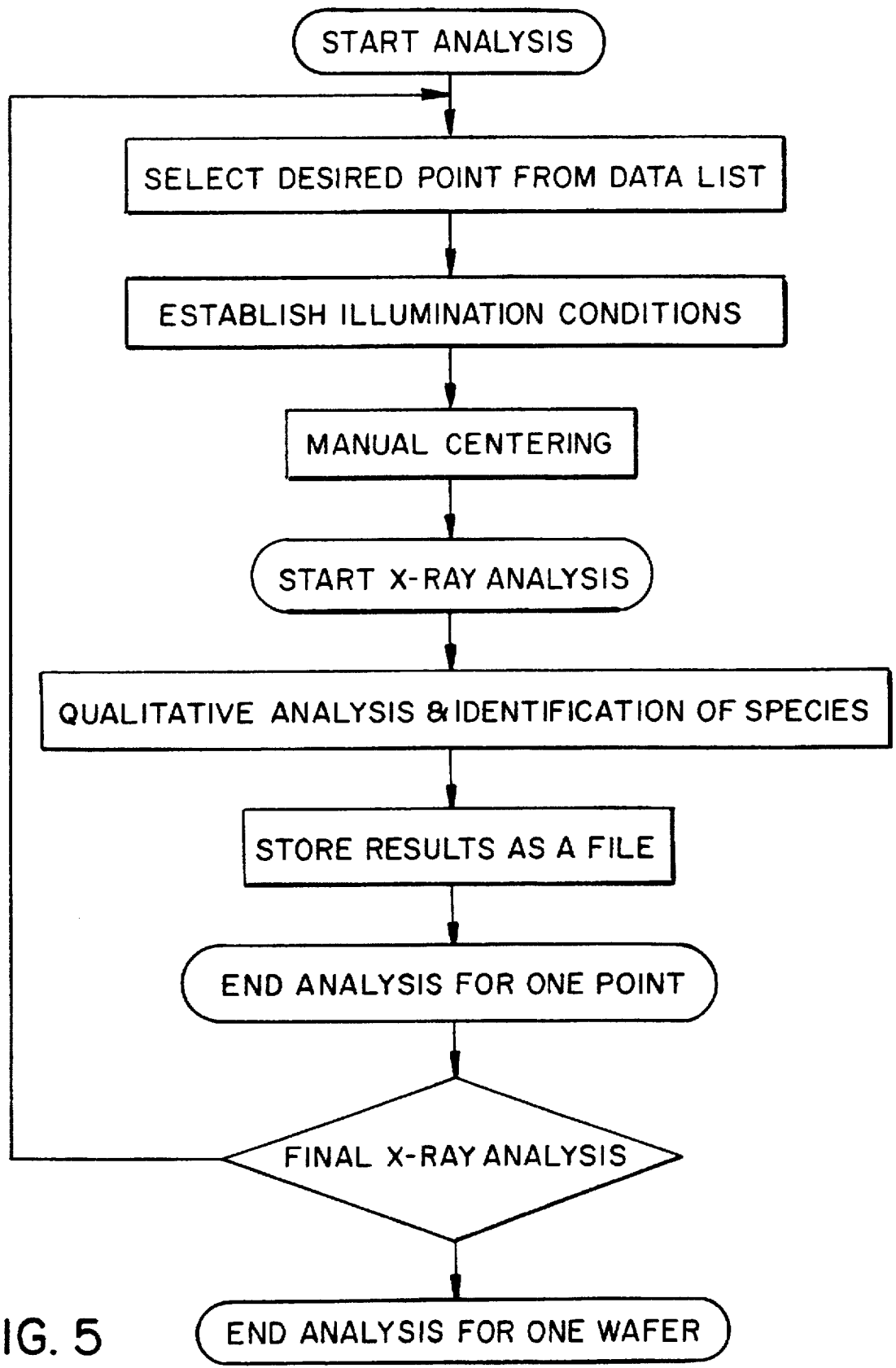
FIG. 5 is a flowchart illustrating the prior art method of making elemental analysis of foreign materials.

PATENT NO. : 5,801,382
DATED : September 1, 1998
INVENTOR(S) : Osamu Noda and Setsuo Norioka It is certified that error appears in the above-identified patent and that said Letters Patent is hereby corrected as shown below:

Column 1 Line 25 "diagram of Fig. 1" should read --diagrams of Figs. 1(a), (b)--.

Column 1 Line 30 "water" should read --wafer--.

Column 1 Line 40 "Fig. 1" should read --Figs. 1(a), (b)--.

Column 3 Line 21 "20:m" should read --20µm--.

Column 3 Line 23 "20:m" should read --20µm--.

Column 3 Line 39 "1000xare" should read --1000 x are--.

Column 4 Line 56 "water" should read --wafer--.

Column 5 Lines 40-41 "is subjected" should read --are subjected--.

Column 5 Line 52 "analysis are made" should read --analysis is made--.

Column 6 Line 59 "diagram" should read --diagrams--.

Column 6 Line 62 "of method of" should read --of a method of--.

Column 7 Line 5 "(b)are" should read --(b) are--.

UNITED STATES PATENT AND TRADEMARK OFFICE
CERTIFICATE OF CORRECTION

PATENT NO. : 5,801,382
DATED : September 1, 1998
INVENTOR(S) : Osamu Noda and Setsuo Norioka It is certified that error appears in the above-identified patent and that said Letters Patent is hereby corrected as shown below:

Column 7 Line 5 "are a schematic block diagram" should read --are schematic block diagrams--.

Figure 7A:
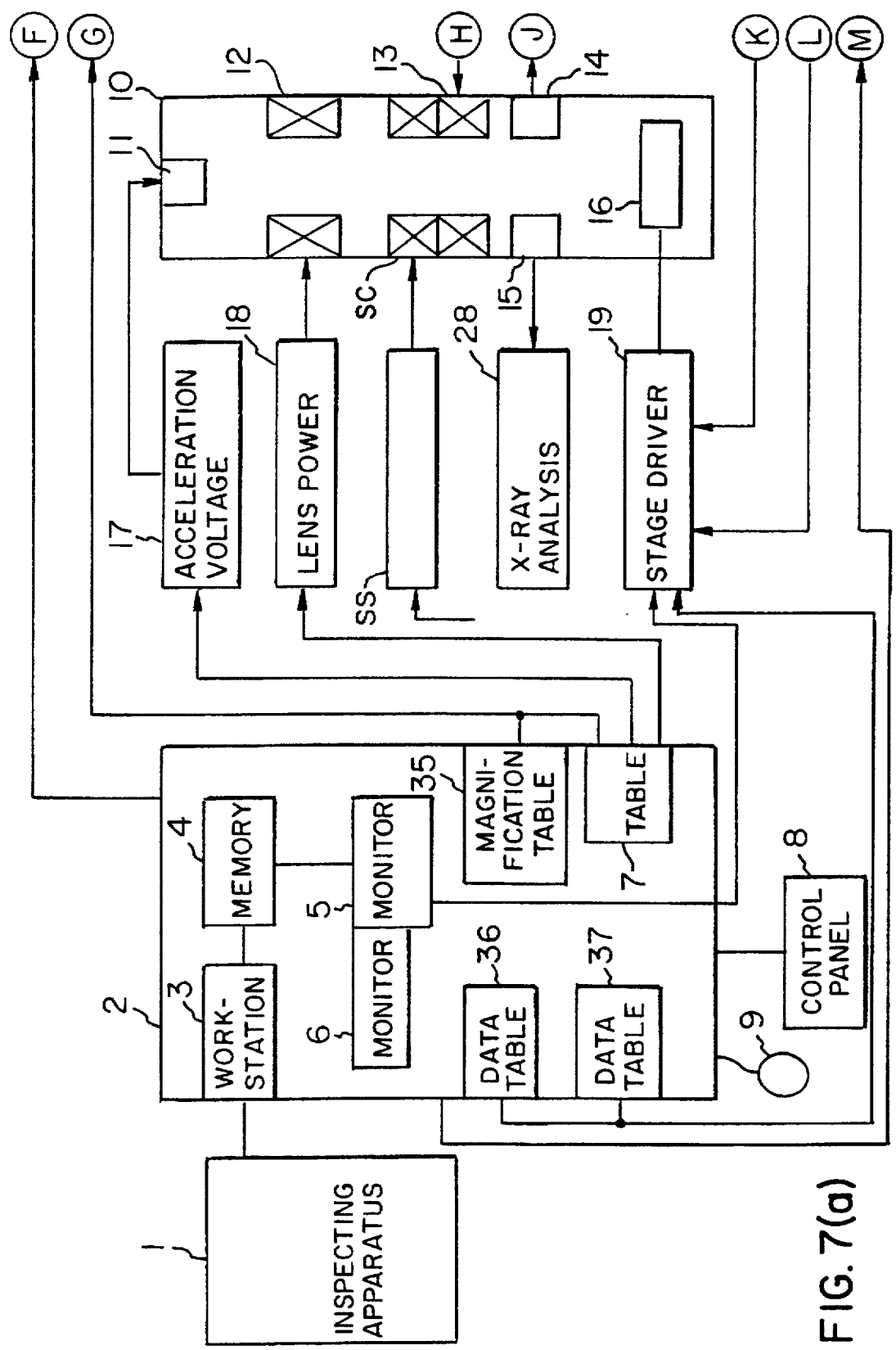

Column 7 Line 22 "Referring to Fig. 7" should read --Referring to Figs. 7(a), (b)--.

Column 7 Line 30 "$Y_1$, $Y_2$" should read --$y_1$, $y_2$--.

Column 8 Line 3 "what he wants" should read --that he wants--.

Column 9 Line 21 "regarding next" should read --regarding the next--.

Column 9 Lines 44-45 "what he wants" should read --that he wants--.

Column 10 Lines 9-10 "what he wants" should read --that he wants--.

Column 10 Line 55 "what the operator" should read --that the operator--.

Column 10 Line 59 "what he wants" should read --that he wants--.

Column 11 Line 8 "Other kind" should read --Other kinds--.

Column 11 Line 25 "what the operator" should read --that the operator--.

UNITED STATES PATENT AND TRADEMARK OFFICE
CERTIFICATE OF CORRECTION

PATENT NO. : 5,801,382
DATED : September 1, 1998
INVENTOR(S) : Osamu Noda and Setsuo Norioka It is certified that error appears in the above-identified patent and that said Letters Patent is hereby corrected as shown below:

Column 11 Line 45 "what the" should read --that the--.

Claim 3 Column 12 Line 30 "claims 1 and 2" should read --claims 1 or 2--.

Claim 4 Column 12 Line 35 "claims 1 and 2" should read --claims 1 or 2--.

Claim 5 Column 12 Line 39 "claims 1 and 2" should read --claims 1 or 2--.

Claim 6 Column 12 Line 44 "claims 1 and 2" should read --claims 1 or 2--.

Signed and Sealed this

Eleventh Day of May, 1999

Attest:

Q. TODD DICKINSON

*Attesting Officer*  *Acting Commissioner of Patents and Trademarks*